US012641729B2

(12) United States Patent
Chen et al.

(10) Patent No.: US 12,641,729 B2
(45) Date of Patent: May 26, 2026

(54) PACKAGE SUBSTRATE AND MANUFACTURING METHOD THEREOF

(71) Applicant: Zhuhai ACCESS Semiconductor Co., Ltd., Guangdong (CN)

(72) Inventors: Xianming Chen, Guangdong (CN); Wenjian Lin, Guangdong (CN); Gao Huang, Guangdong (CN); Lei Feng, Guangdong (CN); Jindong Feng, Guangdong (CN); Benxia Huang, Guangdong (CN); Zhijun Zhang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 574 days.

(21) Appl. No.: 18/174,619

(22) Filed: Feb. 25, 2023

(65) Prior Publication Data

US 2023/0276576 A1 Aug. 31, 2023

(30) Foreign Application Priority Data

Feb. 25, 2022 (CN) .......................... 202210183253.1

(51) Int. Cl.
H05K 1/185 (2026.01)
H05K 1/11 (2006.01)
(Continued)

(52) U.S. Cl.
CPC ............. H05K 1/186 (2013.01); H05K 1/113 (2013.01); H05K 3/108 (2013.01); H05K 3/305 (2013.01);
(Continued)

(58) Field of Classification Search
CPC ........ H05K 1/186; H05K 1/113; H05K 3/108; H05K 3/305; H05K 3/423;
(Continued)

(56) References Cited

U.S. PATENT DOCUMENTS

2009/0071705 A1* 3/2009 Kim ........................ H01L 24/97
174/262
2011/0290540 A1* 12/2011 Jung ....................... H01L 23/13
174/258
2020/0037450 A1* 1/2020 Li .......................... H05K 3/241

FOREIGN PATENT DOCUMENTS

CN 110769598 A 2/2020
CN 111952201 A 11/2020
(Continued)

OTHER PUBLICATIONS

First Office Action for Chinese Patent Application No. 2022101832531 and English translation, mailed Aug. 11, 2023, 9 pages.
(Continued)

*Primary Examiner* — Caleen O Sullivan
(74) *Attorney, Agent, or Firm* — Buchalter; Jason W. Croft

(57) ABSTRACT

A package substrate and a manufacturing method thereof are disclosed. The method includes: providing an inner substrate; processing an adhesive photosensitive material on a surface of a first side of the inner substrate to obtain an adhesive first insulating dielectric layer; mounting a component on the first insulating dielectric layer; and processing a photosensitive packaging material on the first side of the inner substrate to obtain a second insulating dielectric layer, where the second insulating dielectric layer covers the component.

6 Claims, 5 Drawing Sheets

(51) Int. Cl.

| | | |
|---|---|---|
| *H05K 3/00* | (2006.01) | |
| *H05K 3/10* | (2006.01) | |
| *H05K 3/303* | (2026.01) | |
| *H05K 3/42* | (2006.01) | |
| *H10W 70/09* | (2026.01) | |
| *H10W 70/60* | (2026.01) | |
| *H10W 74/01* | (2026.01) | |
| *H10W 74/10* | (2026.01) | |

(52) U.S. Cl.

CPC ............ *H05K 3/423* (2013.01); *H10W 74/01* (2026.01); *H10W 74/114* (2026.01); *H05K 3/0023* (2013.01); *H05K 2201/09481* (2013.01); *H05K 2201/10015* (2013.01); *H05K 2201/10022* (2013.01); *H05K 2203/0723* (2013.01); *H10W 70/09* (2026.01); *H10W 70/60* (2026.01)

(58) Field of Classification Search

CPC .......... H05K 2201/09481; H05K 2201/10015; H05K 2201/10022; H05K 2203/0723; H05K 1/185; H05K 3/30; H05K 1/181; H05K 3/0023; H01L 21/56; H01L 23/3121; H01L 24/19; H01L 24/20; H01L 2224/19; H01L 2224/2101; H01L 23/5329; H01L 23/3107; H01L 23/5226; H01L 24/27; H01L 2224/27618; H10W 70/09; H10W 70/60; H10W 20/42; H10W 74/111; H10W 20/48; H10W 72/01351; H10W 74/01; H10W 74/114

USPC .................................................. 430/311, 313
See application file for complete search history.

(56)         References Cited

FOREIGN PATENT DOCUMENTS

| JP | 2001217337 A | 8/2001 |
|---|---|---|
| JP | 2002171070 A | 6/2002 |
| JP | 2004296562 A | 10/2004 |
| JP | 2008124106 A | 5/2008 |
| JP | 2009231752 A | 10/2009 |
| KR | 20130055820 A | 5/2013 |
| KR | 20160019297 A | 2/2016 |
| TW | 200721934 A | 6/2007 |

OTHER PUBLICATIONS

First Office Action for Japanese Patent Application No. 2023-024012 and English translation, mailed Jan. 16, 2024, 5 pages.
Second Office Action for Japanese Patent Application No. 2023-024012 and English translation, mailed Jul. 9, 2024, 6 pages.
First Office Action for Korean Patent Application No. 10-2023-0019425 and English translation, mailed Oct. 24, 2024, 17 pages.
First Office Action for Taiwanese Patent Application No. 112103986 and English translation, mailed Sep. 12, 2023, 14 pages.
Rejection Decision for Taiwanese Patent Application No. 112103986 and English translation, mailed Jul. 18, 2024, 6 pages.

* cited by examiner

PACKAGE SUBSTRATE AND MANUFACTURING METHOD THEREOF

CROSS-REFERENCE TO RELATED APPLICATION

This application is filed on the basis of Chinese patent application No. 2022101832531 filed Feb. 25, 2022, and claims priority of the Chinese patent application, the entire contents of which are incorporated herein by reference.

TECHNICAL FIELD

The present disclosure relates to the technical field of semiconductor packaging, in particular to a package substrate and a manufacturing method thereof.

BACKGROUND

Embedding electronic components inside a package substrate to achieve high integration and miniaturization of electronic products is the current development trend of electronic products. The package substrate has a multilayer structure, for example, a six-layer package substrate. At present, the components are typically embedded in the cavity of a core board of the package substrate, and then multiple build-up layers and package structures of the package substrate are processed to obtain the package substrate. In the actual production process, multiple build-up layers may be scrapped due to reasons such as accidents or process, so that the components embedded in the core board will be scrapped, resulting in high cost due to the loss of the components. Moreover, the technological process of embedding the components in the cavity of the core board is relatively complicated, resulting in a long processing time.

SUMMARY

The present disclosure aims to solve at least one of the technical problems in the existing technology. To this end, the present disclosure proposes a method for manufacturing a package substrate, which can reduce the cost caused by the loss of a component.

The present disclosure further proposes a package substrate manufactured by the above manufacturing method.

The method for manufacturing a package substrate provided according to an aspect of the present embodiment includes: providing an inner substrate; processing an adhesive photosensitive material on a surface of a first side of the inner substrate to obtain an adhesive first insulating dielectric layer on; mounting a component on the first insulating dielectric layer; and processing a photosensitive packaging material on the first side of the inner substrate to obtain a second insulating dielectric layer, where the second insulating dielectric layer covers the component.

The method for manufacturing a package substrate according to the embodiments of the present disclosure has at least the following beneficial effects. A component is mounted on the basis of an inner substrate without processing a cavity for packaging the component on the inner substrate, which reduces the processing time and processing cost, and is beneficial to avoid the problem of component scrapping caused by damage of the inner substrate during the processing, thus reducing the cost caused by the loss of the component.

According to some embodiments of the present disclosure, the adhesive photosensitive material is an adhesive photosensitive film, and processing an adhesive photosensitive material on a surface of a first side of the inner substrate to obtain an adhesive first insulating dielectric layer includes:

mounting the adhesive photosensitive film on the surface of the first side of the inner substrate to obtain the first insulating dielectric layer; or the adhesive photosensitive material is an adhesive photosensitive liquid, and processing an adhesive photosensitive material the surface of a first side of the inner substrate to obtain an adhesive first insulating dielectric layer includes:

coating the adhesive photosensitive liquid on the surface of the first side of the inner substrate to obtain the first insulating dielectric layer.

Through the above steps, it is easy to obtain the first insulating dielectric layer, which is beneficial to the mounting of the component, thereby reducing the processing time and processing cost, as well as the cost caused by the loss of the component.

According to some embodiments of the present disclosure, processing a photosensitive packaging material on the first side of the inner substrate to obtain a second insulating dielectric layer includes: coating the photosensitive packaging material on the first side of the inner substrate, and covering the component to obtain the second insulating dielectric layer. Through the above steps, it is easy to obtain the second insulating dielectric layer covering the component on the inner substrate, so that the component is located in the second insulating dielectric layer, which is convenient for component packaging, and beneficial to miniaturization.

According to some embodiments of the present disclosure, a circuit layer is provided on the inner substrate, at least one connection point is provided on the circuit layer, an attaching area is provided on the first side of the inner substrate, and the first insulating dielectric layer is located in the attaching area. The manufacturing method further includes:

machining a first blind hole in the second insulating dielectric layer by means of exposure and development; or machining the first blind hole and a second blind hole in the second insulating dielectric layer by means of exposure and development.

The position of the first blind hole corresponds to the position of a connection terminal of the component, the position of the second blind hole corresponds to the position of the connection point of the circuit layer, and the first blind hole and the second blind hole both extend across the second insulating dielectric layer. Through the above steps, it is easy to obtain blind holes with higher inner wall flatness, better verticality and deeper depth, subsequent connections of a circuit outer layer with the circuit layer and component are facilitated, and the conductive effect is improved.

According to some embodiments of the present disclosure, a circuit layer is provided on the inner substrate, and at least one connection point is provided on the circuit layer. The manufacturing method further includes:

machining a first blind hole in the second insulating dielectric layer by means of exposure and development; or by means of exposure and development, machining the first blind hole in the second insulating dielectric layer, and machining a second blind hole in the first insulating dielectric layer and the second insulating dielectric layer.

The position of the first blind hole corresponds to the position of the connection terminal of the component, the position of the second blind hole corresponds to the position of the connection point of the circuit layer, the first blind hole extends across the second insulating dielectric layer, and the second blind hole extends across both the first insulating dielectric layer and the second insulating dielectric layer. Through the above steps, it is easy to obtain blind holes with higher inner wall flatness, better verticality and deeper depth, subsequent connections of an outer circuit layer with the circuit layer and component are facilitated, and the conductive effect is improved.

According to some embodiments of the present disclosure, a circuit layer is provided on the inner substrate, and the manufacturing method further includes:

processing on the second insulating dielectric layer by means of pattern transfer and pattern electroplating to obtain an outer circuit layer which is connected to the circuit layer and the component; or processing on the second insulating dielectric layer and a second side of the inner substrate by means of pattern transfer and pattern electroplating to obtain an outer circuit layer which is connected to the circuit layer and the component. Through the above steps, it is easy to respectively connect the circuit layer of the inner substrate and the component mounted on the inner substrate to the outer circuit layer.

According to some embodiments of the present disclosure, processing on the second insulating dielectric layer by means of pattern transfer and pattern electroplating to obtain an outer circuit layer which is connected to the circuit layer and the component includes:

processing on the second insulating dielectric layer to obtain a seed layer; and processing a photosensitive mask material on the seed layer to obtain the outer circuit layer which is connected to the circuit layer and the component; or processing on the second insulating dielectric layer and a second side of the inner substrate by means of pattern transfer and pattern electroplating to obtain an outer circuit layer which is connected to the circuit layer and the component includes:

processing on the second side of the inner substrate and the second insulating dielectric layer to obtain the seed layer; and processing a photosensitive mask material on the seed layer to obtain the outer circuit layer which is connected to the circuit layer and the component. Through the above steps, it is easy to obtain the outer circuit layer.

According to some embodiments of the present disclosure, the method further includes: processing a reinforced dielectric material on the second side of the inner substrate and the second insulating dielectric layer to obtain a reinforced dielectric layer, where the reinforced dielectric layer covers the outer circuit layer, which improves the rigidity of the package substrate, thereby facilitating the use of the package substrate.

A package substrate provided according to the embodiments of another aspect of the present disclosure is manufactured by the above method for manufacturing a package substrate.

The package substrate according to the embodiments of the present disclosure at least has the following beneficial effects. According to the package substrate manufactured by the above method for manufacturing a package substrate, the cost caused by the loss of a component is lowered due to reduced processing time, which is beneficial to reduce the production cost of the package substrate.

The package substrate provided according to the embodiments of another aspect of the present disclosure includes an inner substrate, a component and an insulating dielectric outer layer, where the insulating dielectric outer layer is obtained by processing a photosensitive material, the component and the insulating dielectric outer layer are both arranged on a first side of the inner substrate, and the component is located in the insulating dielectric outer layer.

The package substrate according to the embodiments of the present disclosure at least has the following beneficial effects. A component is packaged on the basis of an inner substrate, so that the component is located in an insulating dielectric outer layer and located on a first side of the inner substrate, thereby avoiding component scrapping caused by damage of the inner substrate, which is beneficial to reduce the cost caused by the loss of the component. In addition, the arrangement of the component in the inner substrate is beneficial to reduce the processing difficulty as well as the processing time and processing cost.

Additional aspects and advantages of the present disclosure will be set forth in part in the description which follows, and in part will become apparent from the description, or may be learned by practice of the present disclosure.

BRIEF DESCRIPTION OF DRAWINGS

The above and/or additional aspects and advantages of the present disclosure will become apparent and comprehensible from the description of the embodiments in conjunction with the following accompanying drawings, wherein.

Figure 1:
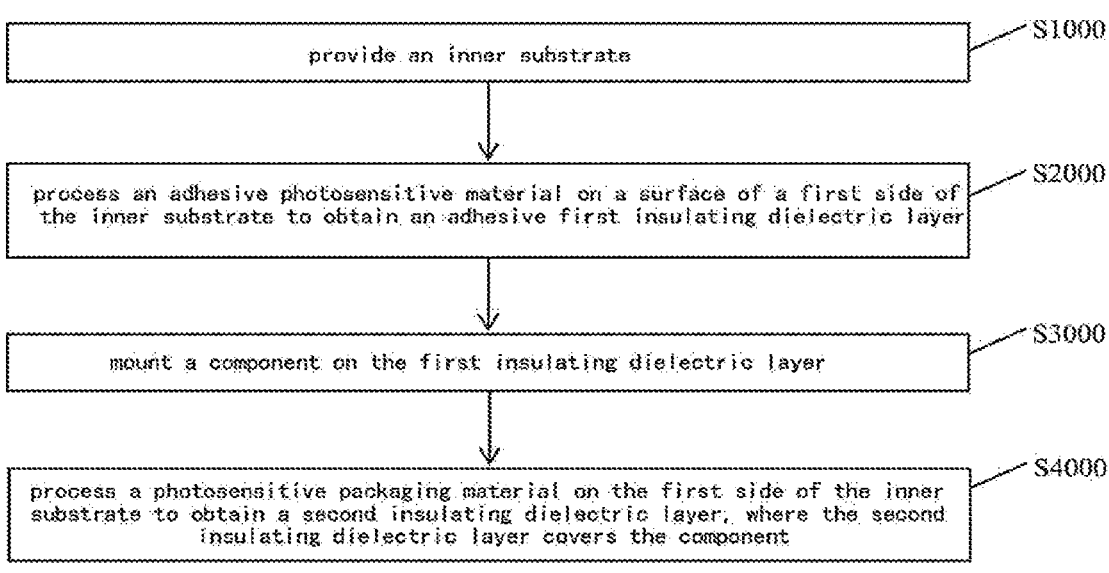
FIG. 1 is a flowchart of a method for manufacturing a package substrate provided by the embodiments of the present disclosure.

The reference numeral listing is as follows:

inner substrate 100, circuit layer 110, first insulating dielectric layer 200, component 300, second insulating dielectric layer 400, first blind hole 410, second blind hole 420, seed layer 500, pattern layer 600, first pattern 610, outer circuit layer 700, reinforced dielectric layer 800, via 900, surface circuit layer 1000, and protective layer 1100.

DETAILED DESCRIPTION

Embodiments of the present disclosure will be described in detail below, and examples of the embodiments are shown in the accompanying drawings, wherein throughout the same or similar reference numerals denote the same or similar elements or elements having the same or similar functions. The following embodiments described with reference to the accompanying drawings are exemplary and serve only to explain the present disclosure, and should not be construed as limiting the present disclosure.

In the description of the present disclosure, it is to be understood that, when referring to orientation description, the indicated orientation or positional relationships, for example, upper, lower, front, rear, left, right, etc., are based on the orientation or positional relationships shown in the accompanying drawings, merely for ease of description of the present disclosure and simplification for the description, rather than indicating or implying that the device or element referred to must have a specific orientation and be constructed and operated in a specific orientation, which, therefore, cannot be construed as limiting the present disclosure.

In the description of the present disclosure, several refers to one or more, multiple refers to two or more, greater than, less than, over and the like are understood not to include the number that follows, and above, below, within and the like are understood to include the number that follows. If described, first and second are only for the purpose of distinguishing between technical features, and not to be construed as indicating or implying relative importance or implicitly indicating the number of technical features indicated or implicitly indicating the precedence relationship of technical features indicated.

In the description of the present disclosure, unless explicitly defined otherwise, providing, installing, connecting and other words should be understood broadly, and a person of ordinary skill in the art can reasonably determine the specific meaning of the above words in the present disclosure combined with the specific content of the technical solution.

A package substrate can provide functions such as electrical connection, protection, support, heat dissipation, and assembly for a component 300, so as to achieve the purposes of multi-pin, reduced volume of packaged products, improved electrical performance and heat dissipation, and multi-chip modularization.

In the related art, the processing flow of a package substrate typically includes inner layer processing and outer layer processing. The steps of inner layer processing include processing a core board of the package substrate, so as to realize embedding a component 300 in the core board. In some applications, the steps of inner layer processing further include processing one or more build-up layers onto the core board. The steps of outer layer processing include processing an outer circuit layer on the basis of a semi-finished product obtained from the inner layer processing. In the above processing flow, the build-up layers are processed after the component 300 is embedded. Since the embedding process of the component 300 is relatively complicated, and the build-up processing may fail or be damaged due to an accident, the component 300 will be scrapped, resulting in high cost caused by the loss of the component 300.

Referring to FIG. 1, a method for manufacturing a package substrate provided in the present disclosure includes step S1000, step S2000, step S3000 and step S4000.

S1000, providing an inner substrate 100.

According to means of production, the inner substrate 100 may be a single-layer board, a double-sided board or a multi-layer board, etc. To be specific, when the inner substrate 100 is a single-layer board or a double-sided board, a semi-finished product that has been subjected to core board processing is used as the inner substrate 100; when the inner substrate 100 is a multi-layer board, the semi-finished product that has been subjected to core board and build-up processing is used as the inner substrate 100. For example, for a package substrate with a six-layer structure, the semi-finished product with a five-layer structure can be used as the inner substrate 100 of this embodiment, and the package substrate with the six-layer structure is obtained using the manufacturing method provided in this embodiment. Alternatively, for a package substrate with a two-layer structure, the semi-finished product with a one-layer structure can be used as the inner substrate 100 of this embodiment, and the package substrate with the two-layer structure is obtained using the manufacturing method provided in this embodiment.

It is worth mentioning that, as mentioned above, the embedded packaging of the component 300 in the related art is performed during the inner layer processing, while S1000 is performed after the inner layer processing is completed and before the outer layer processing starts. In this way, the processing steps after the component 300 is mounted can be reduced as much as possible, and the probability of scrapping of the component 300 due to processing failure can be reduced.

S2000, processing an adhesive photosensitive material on a surface of a first side of the inner substrate 100 to obtain an adhesive first insulating dielectric layer 200.

S3000, mounting a component 300 on the first insulating dielectric layer 200.

The component 300 is arranged on the first side of the inner substrate 100 using the adhesive photosensitive material. Compared with the method of arranging the component 300 in a cavity of the core board, the complexity of the processing technology can be simplified, and the processing time and processing cost can be reduced. In addition, the adhesive photosensitive material is a material with photosensitive properties, so that blind holes with better performance can be machined later. For example, epoxy resin can be used for the adhesive photosensitive material, which is a high molecular polymer. Due to the chemical activity of an epoxy group, the epoxy group can be ring-opened by a variety of compounds containing active hydrogen, and then cured and cross-linked to form a network structure. Therefore, the epoxy resin is also a thermosetting resin and has good heat resistance and electrical insulation, as well as strong adhesion to metal.

In addition, S2000 and S3000 are performed after S1000 and before S4000, that is, the processing of the inner substrate 100 has been completed, and the second insulating dielectric layer 400 has not yet been obtained. For example, when the inner substrate 100 is a single-layer board or a double-sided board, before steps S2000 and S3000 are performed, the processing of the core board needs to be completed first, and the second insulating dielectric layer 400 has not been obtained yet. When the inner substrate 100 is a multi-layer board, before S2000 and S3000 are performed, the processing of the core board and the build-up layers needs to be completed first, and the second insulating dielectric layer 400 has not been obtained yet.

It should be noted that the component 300 may be an active device, such as an integrated chip, and the component 300 may also be a passive device, such as a chip fixed resistor and a chip fixed capacitor.

S4000, processing a photosensitive packaging material on the first side of the inner substrate 100 to obtain a second insulating dielectric layer 400, where the second insulating dielectric layer 400 covers the component 300.

The second insulating dielectric layer 400 is used for the packaging of the component 300, so as to make full use of a wiring area of the packaging substrate and facilitate miniaturization. It should be noted that epoxy resin may also be used as the photosensitive packaging material.

Through the above steps S1000 to S4000, the second insulating dielectric layer 400 is obtained on the basis of mounting the component 300 on the inner substrate 100, and the processing of the packaging substrate is completed. In the above process, the processing the component 300 is post-set, and the component 300 is located in the second insulating dielectric layer 400, so as to avoid component 300 scrapping caused by damage of the core board and the build-up layers when processing the core board and the build-up layers in the inner substrate 100, thereby reducing the cost caused by the loss of the component 300. In addition, the component 300 is not embedded in the cavity of the core board, which is also beneficial to reduce the processing difficulty as well as the processing time and processing cost.

Referring to FIG. 2 to FIG. 11, embodiments of the present disclosure provide schematic cross-sectional views of the package substrate. The schematic cross-sectional views of the package substrate shown in FIG. 2 to FIG. 11 correspond to the intermediate process of the method for manufacturing a package substrate provided by the embodiments of the present disclosure.

Figure 2:
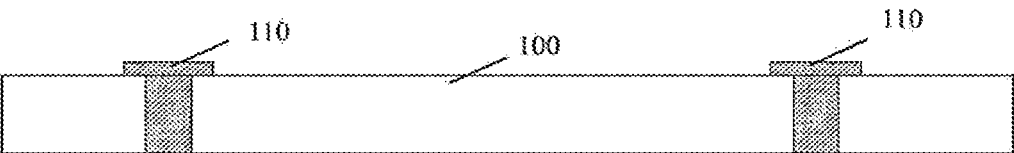
FIG. 2 to FIG. 12 are schematic cross-sectional views of the package substrate corresponding to the intermediate process of the method for manufacturing a package substrate provided by the embodiments of the present disclosure.

Referring to FIG. 2, the inner substrate 100 provided in this embodiment is provided with a circuit layer 110, so that a subsequently provided outer circuit layer 700 and the component 300 can establish an electrical connection with the inner substrate 100.

Figure 3:
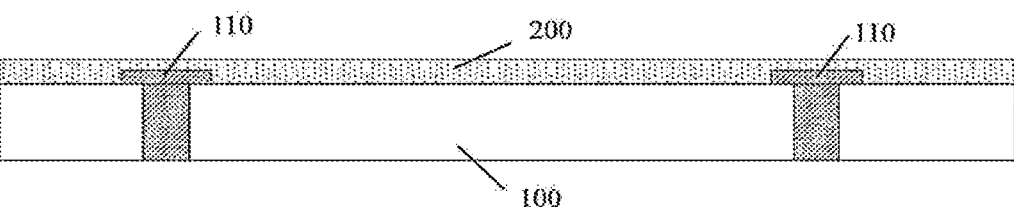
Figure 4:
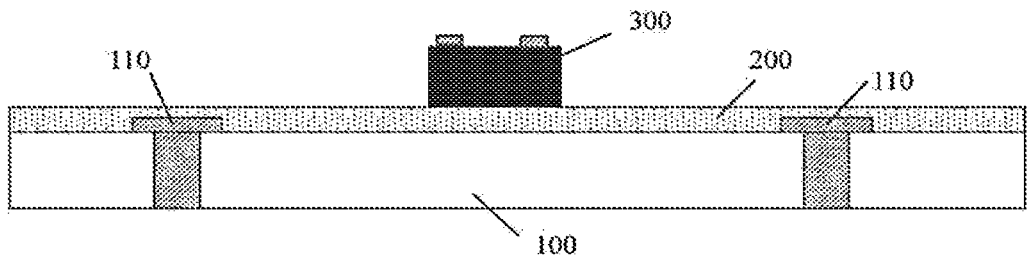

Referring to FIG. 3 and FIG. 4, when the adhesive photosensitive material is an adhesive photosensitive film, S2000 includes a step S2100; and when the adhesive photosensitive material is an adhesive photosensitive liquid, S2000 includes a step S2200.

S2100, mounting the adhesive photosensitive film on the surface of the first side of the inner substrate 100 to obtain the first insulating dielectric layer 200.

S2200, coating the adhesive photosensitive liquid on the surface of the first side of the inner substrate 100 to obtain the first insulating dielectric layer 200.

The adhesive photosensitive material not only has photosensitive properties, but also has viscosity. When the adhesive photosensitive material is liquid, the first insulating dielectric layer 200 can be obtained on the first side of the inner substrate 100 by coating. When the adhesive photosensitive material is solid, the first insulating dielectric layer 200 can be obtained on the first side of the inner substrate 100 by mounting. The first insulating dielectric layer 200 has both photosensitive properties and viscosity, which is convenient for the mounting of the component 300, and facilitates subsequent machining of blind holes with better performance. The first insulating dielectric layer 200 may completely cover the first side of the inner substrate 100, or may only cover the position where the component 300 needs to be mounted.

Figure 5:
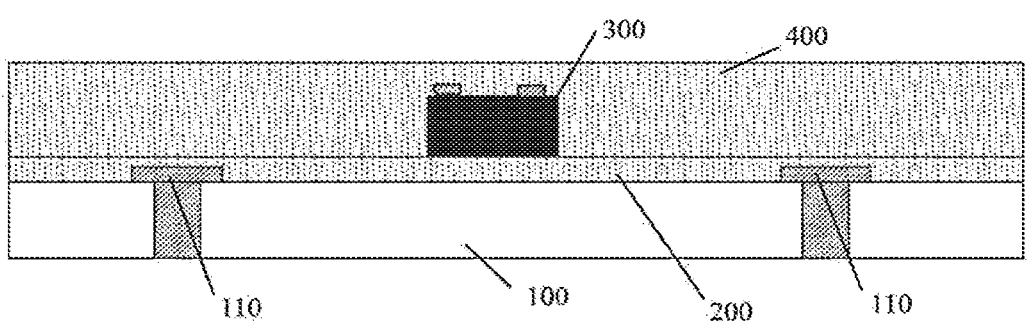

Referring to FIG. 5, S4000 may include a step S4100.

S4100, coating the photosensitive packaging material on the first side of the inner substrate 100, and covering the component 300 to obtain the second insulating dielectric layer 400.

Since the component 300 is mounted on the surface of the first side of the inner substrate 100, the surface of the first side of the inner substrate 100 is uneven, and the liquid photosensitive packaging material can then be coated on the first side of the inner substrate 100 to cover the component 300, thereby obtaining the second insulating dielectric layer 400. In addition, the photosensitive packaging material has photosensitive properties, so that blind holes with better performance can be machined subsequently on the basis of the second insulating dielectric layer 400.

In some embodiments, a circuit layer 110 is provided on the inner substrate 100, at least one connection point is provided on the circuit layer 110, an attaching area is provided on the first side of the inner substrate 100, and the first insulating dielectric layer 200 is located in the attaching area. The above method for manufacturing a package substrate further includes a step S5100 or a step S5200.

S5100, machining a first blind hole 410 in the second insulating dielectric layer 400 by means of exposure and development.

S5200, machining the first blind hole 410 and a second blind hole 420 in the second insulating dielectric layer 400 by means of exposure and development.

The position of the first blind hole 410 corresponds to the position of a connection terminal of the component 300, the position of the second blind hole 420 corresponds to the position of the connection point of the circuit layer 110, and the first blind hole 410 and the second blind hole 420 both extend across the second insulating dielectric layer 400.

Figure 6:
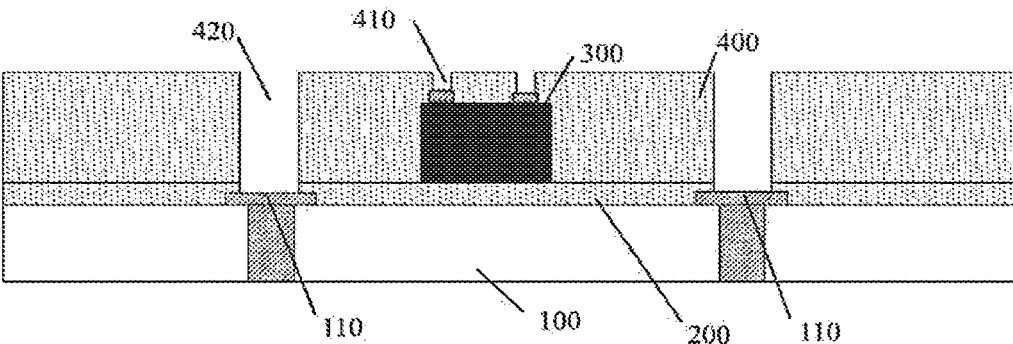

In this embodiment, referring to FIG. 6, a circuit layer 110 is provided on the inner substrate 100, and at least one connection point is provided on the circuit layer 110. The above method for manufacturing a package substrate further includes a step S5300 or a step S5400.

S5300, machining a first blind hole 410 in the second insulating dielectric layer 400 by means of exposure and development.

S5400, machining the first blind hole 410 in the second insulating dielectric layer 400, and machining a second blind hole 420 in the first insulating dielectric layer 200 and the second insulating dielectric layer 400 by means of exposure and development.

The position of the first blind hole 410 corresponds to the position of a connection terminal of the component 300, the position of the second blind hole 420 corresponds to the position of the connection point of the circuit layer, the first blind hole 410 extends across the second insulating dielectric layer 400, and the second blind hole 420 extends across both the first insulating dielectric layer 200 and the second insulating dielectric layer 400.

The first blind hole 410 is used to enable the connection terminal of the component 300 to be electrically connected to the outside, and the second blind hole 420 is used to enable the connection point of the circuit layer 110 to be electrically connected to the outside. For example, the subsequently provided outer circuit layer 700 can be connected to the component 300 through the first blind hole 410, and connected to the circuit layer 110 of the inner substrate 100 through the second blind hole 420. In addition, the first blind hole 410 and the second blind hole 420 with higher inner wall flatness, better verticality and deeper depth can be machined in the second insulating dielectric layer 400, or in the second insulating dielectric layer 400 and the first insulating dielectric layer 200 by means of exposure and development.

In addition, since both the adhesive photosensitive material and the photosensitive packaging material have photosensitive properties, in S5400, the second blind hole 420 is easier to extend across the second insulating dielectric layer 400 and the first insulating dielectric layer 200, which is beneficial to reduce the complexity of the processing technology and the processing time, and can help to avoid the situation that the second blind hole 420 cannot extend across the second insulating dielectric layer 400 and the first insulating dielectric layer 200, thus the yield rate can be improved.

The position of the first blind hole 410 corresponds to the connection terminal of the component 300, that is, the connection terminal of the component 300 can be connected to the subsequently processed outer circuit layer 700 through the first blind hole 410. The position of the second blind hole 420 corresponds to the connection point of the circuit layer 110, that is, the circuit layer 110 can be connected to the subsequently processed outer circuit layer 700 through the second blind hole 420.

Referring to FIG. 7 to FIG. 10, a circuit layer 110 is provided on the inner substrate 100, and the above method for manufacturing a package substrate further includes a step S6100 or a step S6200.

S6100, processing on the second insulating dielectric layer 400 to obtain an outer circuit layer 700 which is connected to the circuit layer 110 and the component 300 by means of pattern transfer and pattern electroplating.

S6200, processing on the second insulating dielectric layer 400 and a second side of the inner substrate 100 to obtain an outer circuit layer 700 which is connected to the circuit layer 110 and the component 300 by means of pattern transfer and pattern electroplating.

The outer circuit layer 700 is used to establish an electrical connection with the circuit layer 110 and the component 300 of the inner substrate 100, so that the circuit layer 110 and the component 300 can conduct signal transmission with the outside.

Specifically, S6100 may include a step S6110 and a step S6120.

S6100, processing on the second insulating dielectric layer 400 to obtain a seed layer 500.

S6120, processing a photosensitive mask material on the seed layer 500 to obtain the outer circuit layer 700 which is connected to the circuit layer 110 and the component 300.

The S6200 may include a step S6210 and a step S6220.

S6210, processing on the second side of the inner substrate 100 and the second insulating dielectric layer 400 to obtain the seed layer 500.

S6220, processing a photosensitive mask material on the seed layer 500 to obtain the outer circuit layer 700 which is connected to the circuit layer 110 and the component 300.

Figure 7:
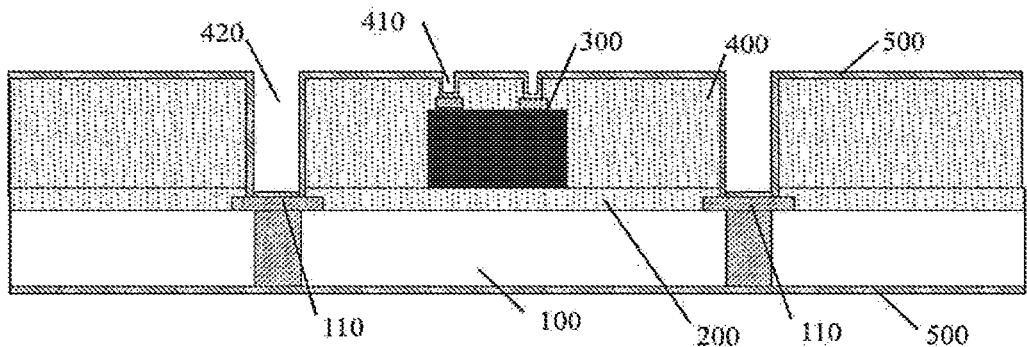
Figure 8:
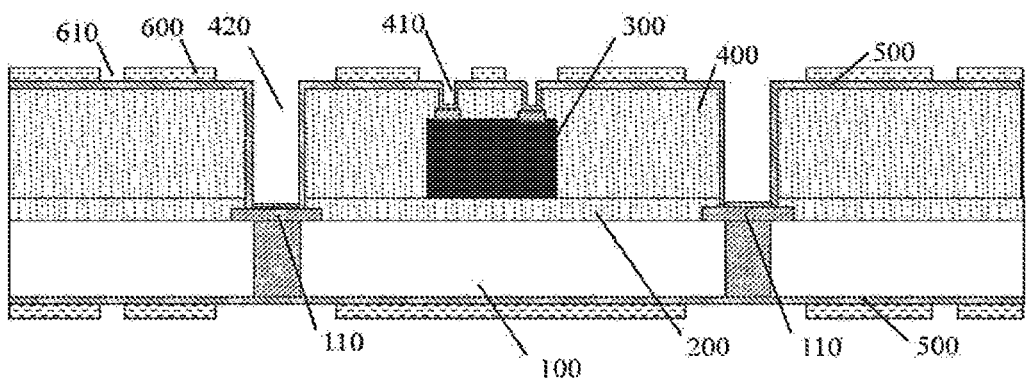

The seed layer 500, serving as the basis of electroplating, can improve the bonding force between the second insulating dielectric layer 400 and the outer circuit layer 700, and can improve the bonding force between the inner substrate 100 and the outer circuit layer 700, so that the connections between the outer circuit layer 700 subsequently processed on the seed layer 500 and the component 300 and the circuit layer 110 are tighter. Referring to FIG. 7, the seed layer 500 is obtained on the second side of the inner substrate 100 and the second insulating dielectric layer 400. Referring to FIG. 8, a pattern layer 600 having a first pattern 610 is formed on the seed layer 500 by means of pattern transfer.

Figure 9:
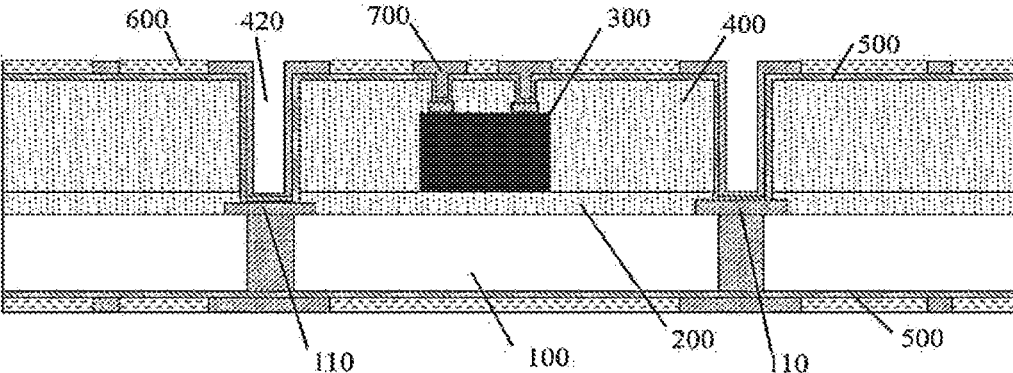
Figure 10:
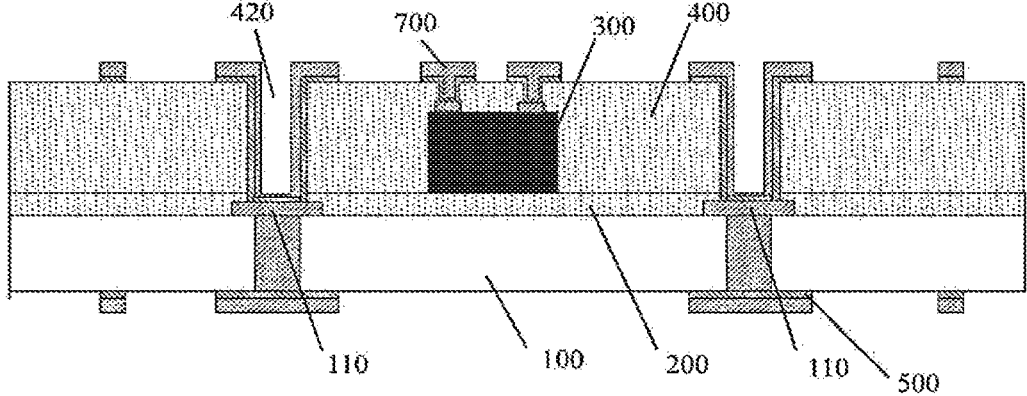

Referring to FIG. 9, the outer circuit layer 700 is obtained on the first pattern 610 by means of electroplating. Referring to FIG. 10, the pattern layer 600 and part of the seed layer 500 are removed through processes such as film removal, etching, and the like.

Figure 11:
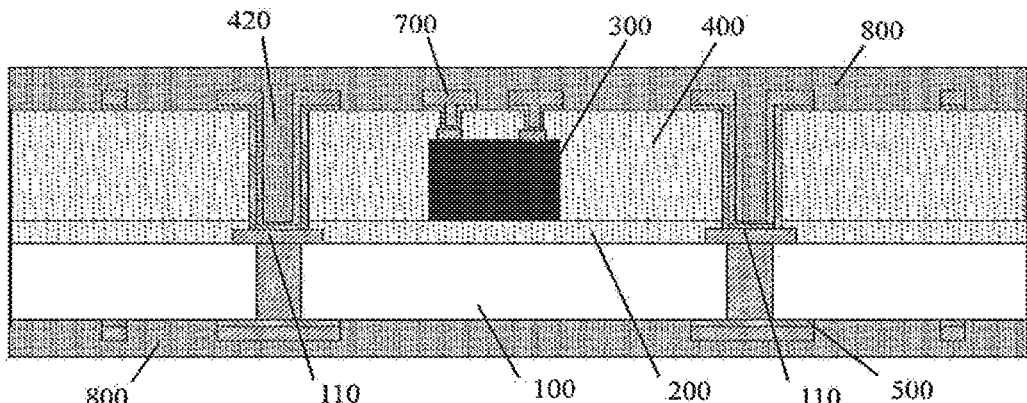

Referring to FIG. 11, the above method for manufacturing a package substrate may further include a step S7000.

S7000, processing a reinforced dielectric material on the second side of the inner substrate 100 and the second insulating dielectric layer 400 to obtain a reinforced dielectric layer 800, where the reinforced dielectric layer 800 covers the outer circuit layer 700.

The reinforced dielectric layer 800 is obtained by processing a reinforced dielectric material. The reinforced dielectric material may be made of glass fiber dielectric material, which is an inorganic non-metallic material with the advantages such as light weight, high strength, high temperature resistance, corrosion resistance, heat insulation, sound absorption, and good electrical insulation performance. The reinforced dielectric layer 800 obtained by processing the reinforced dielectric material can improve the rigidity of the package substrate, to protect the package substrate.

Figure 12:
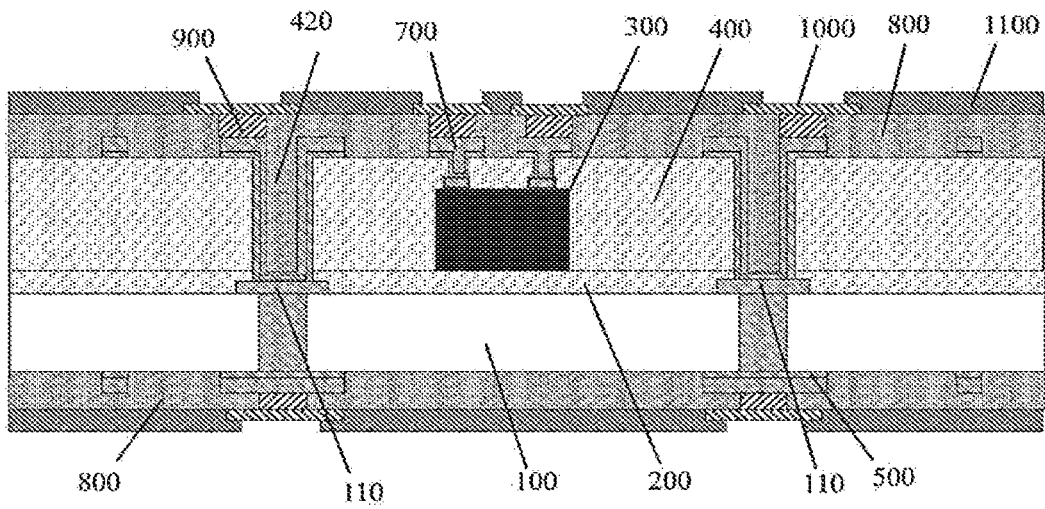

In addition, referring to FIG. 12, after S7000, the outer circuit layer 700 is covered under the reinforced dielectric layer 800. In order to make the package substrate have corresponding functions, a via 900 may be machined in the reinforced dielectric layer 800, and a surface circuit layer 1000 is obtained on the surface of the reinforced dielectric layer 800 through processing, to make the surface circuit layer 1000 electrically connected to the outer circuit layer 700 through the via 900, so that an external circuit can be electrically connected to the component 300 in the package substrate through the surface circuit layer 1000. After the processing of the surface circuit layer 1000 is completed, the surface of the reinforced dielectric layer 800 may also be surface treated, to complete the processing of the package substrate. For example, liquid photo-induced solder mask is coated on the surface of the reinforced dielectric layer 800 to cover the surface circuit layer 1000, thereby obtaining a protective layer 1100.

Referring to FIG. 5 or FIG. 11, this embodiment further provides a package substrate, which is manufactured by the above-mentioned method for manufacturing a package substrate. According to the package substrate manufactured by the above-mentioned method for manufacturing a package substrate, the cost caused by the loss of the component 300 is lowered due to reduced processing time, which is beneficial to reduce the production cost of the package substrate.

Referring to FIG. 5, in another aspect of this embodiment, a package substrate is provided, including an inner substrate 100, a component 300 and an insulating dielectric outer layer. The insulating dielectric outer layer is obtained by processing a photosensitive material, the component 300 and the insulating dielectric outer layer are both arranged on a first side of the inner substrate 100, and the component 300 is located in the insulating dielectric outer layer.

The insulating dielectric outer layer includes a first insulating dielectric layer 200 and a second insulating dielectric layer 400 which may be made by processing the same photosensitive material, such as epoxy resin. The component 300 is packaged on the basis of the inner substrate 100, so that the component 300 is located in the insulating dielectric outer layer and located on the first side of the inner substrate 100, thereby avoiding component 300 scrapping caused by damage of the inner substrate 100, which is beneficial to reduce the cost caused by the loss of the component 300. In addition, the arrangement of the component 300 in the inner substrate 100 is beneficial to reduce the processing difficulty as well as the processing time and processing cost. It should be noted that the package substrate of this embodiment can be obtained through the above-mentioned method for manufacturing a package substrate, and the content not described may refer to above, which will not be repeated here to avoid redundancy.

The embodiments of the present disclosure have been described in detail above in conjunction with the accompanying drawings, but the present disclosure is not limited to the above-mentioned embodiments, and in the scope of knowledge of those of ordinary skill in the art, various modifications can be made without departing from the gist of the present disclosure.

The invention claimed is:

1. A method for manufacturing a package substrate, comprising:

providing an inner substrate;

processing an adhesive photosensitive material on a surface of a first side of the inner substrate to obtain an adhesive first insulating dielectric layer;

mounting a component on the first insulating dielectric layer; and processing a photosensitive packaging material on the first side of the inner substrate to obtain a second insulating dielectric layer, wherein the second insulating dielectric layer covers the component;

wherein a circuit layer is provided on the first side of the inner substrate, at least one connection point is provided on the circuit layer;

machining the first blind hole in the second insulating dielectric layer, and machining a second blind hole in the first insulating dielectric layer and the second insulating dielectric layer by means of exposure and development;

wherein a position of the first blind hole corresponds to a position of a connection terminal of the component, a position of the second blind hole corresponds to a position of the connection point of the circuit layer, the first blind hole extends across the second insulating dielectric layer, and the second blind hole extends across both the first insulating dielectric layer and the second insulating dielectric layer.

2. The method for manufacturing a package substrate of claim 1, wherein the adhesive photosensitive material is an adhesive photosensitive film, and processing an adhesive photosensitive material on a surface of a first side of the inner substrate to obtain an adhesive first insulating dielectric layer comprises:

mounting the adhesive photosensitive film on the surface of the first side of the inner substrate to obtain the first insulating dielectric layer;

or, the adhesive photosensitive material is an adhesive photosensitive liquid, and processing an adhesive photosensitive material on a surface of a first side of the inner substrate to obtain an adhesive first insulating dielectric layer comprises:

coating the adhesive photosensitive liquid on the surface of the first side of the inner substrate to obtain the first insulating dielectric layer.

3. The method for manufacturing a package substrate of claim 1, wherein processing a photosensitive packaging material on the first side of the inner substrate to obtain a second insulating dielectric layer comprises:

coating the photosensitive packaging material on the first side of the inner substrate, and covering the component to obtain the second insulating dielectric layer.

4. The method for manufacturing a package substrate of claim 1, wherein a circuit layer is provided on the inner substrate, and the method further comprises:

processing on the second insulating dielectric layer to obtain an outer circuit layer which is connected to the circuit layer and the component by means of pattern transfer and pattern electroplating;

or, processing on the second insulating dielectric layer and a second side of the inner substrate to obtain an outer circuit layer which is connected to the circuit layer and the component by means of pattern transfer and pattern electroplating.

5. The method for manufacturing a package substrate of claim 4, wherein processing on the second insulating dielectric layer to obtain an outer circuit layer which is connected to the circuit layer and the component by means of pattern transfer and pattern electroplating comprises:

processing on the second insulating dielectric layer to obtain a seed layer; and processing a photosensitive mask material on the seed layer to obtain the outer circuit layer which is connected to the circuit layer and the component;

or, processing on the second insulating dielectric layer and a second side of the inner substrate to obtain an outer circuit layer which is connected to the circuit layer and the component by means of pattern transfer and pattern electroplating comprises:

processing on the second side of the inner substrate and the second insulating dielectric layer to obtain the seed layer; and processing a photosensitive mask material on the seed layer to obtain the outer circuit layer which is connected to the circuit layer and the component.

6. The method for manufacturing a package substrate of claim 4, further comprising:

processing a reinforced dielectric material on the second side of the inner substrate and the second insulating dielectric layer to obtain a reinforced dielectric layer, wherein the reinforced dielectric layer covers the outer circuit layer.

* * * * *